United States Patent [19]
Ikeda

[11] Patent Number: 5,319,321
[45] Date of Patent: Jun. 7, 1994

[54] DIGITAL PLL CIRCUIT

[75] Inventor: Yuichiro Ikeda, Kanagawa, Japan

[73] Assignee: NEC Corporation, Tokyo, Japan

[21] Appl. No.: 12,232

[22] Filed: Feb. 2, 1993

[30] Foreign Application Priority Data

Feb. 18, 1992 [JP] Japan .................................. 4-029844

[51] Int. Cl.$^5$ ............................................ H03L 7/091
[52] U.S. Cl. ..................................... 331/1 A; 331/14; 331/17; 331/25
[58] Field of Search ...................... 331/1 A, 17, 25, 14

[56] References Cited

U.S. PATENT DOCUMENTS 3,602,834  8/1971  McAuliffe ............................. 331/14
3,840,821 10/1974  Conway ................................. 331/17

Primary Examiner—Andrew M. Dolinar
Attorney, Agent, or Firm—Whitham & Marhoefer

[57] ABSTRACT

A digital PLL circuit capable of stabilizing a phase comparison operation to largely reduce a jitter of an output signal, including a peak detection circuit for detecting a peak of an input signal level, a two-points sampling circuit for sampling two data points determined at a predetermined time interval in the peak to output two sample values, an inclination calculation circuit for calculating an inclination value from the two sample values, and a discrimination circuit for discriminating whether the inclination value is zero or either a positive or negative value to output a control signal for a VCO depending on the discrimination result.

4 Claims, 7 Drawing Sheets

F I G. 3
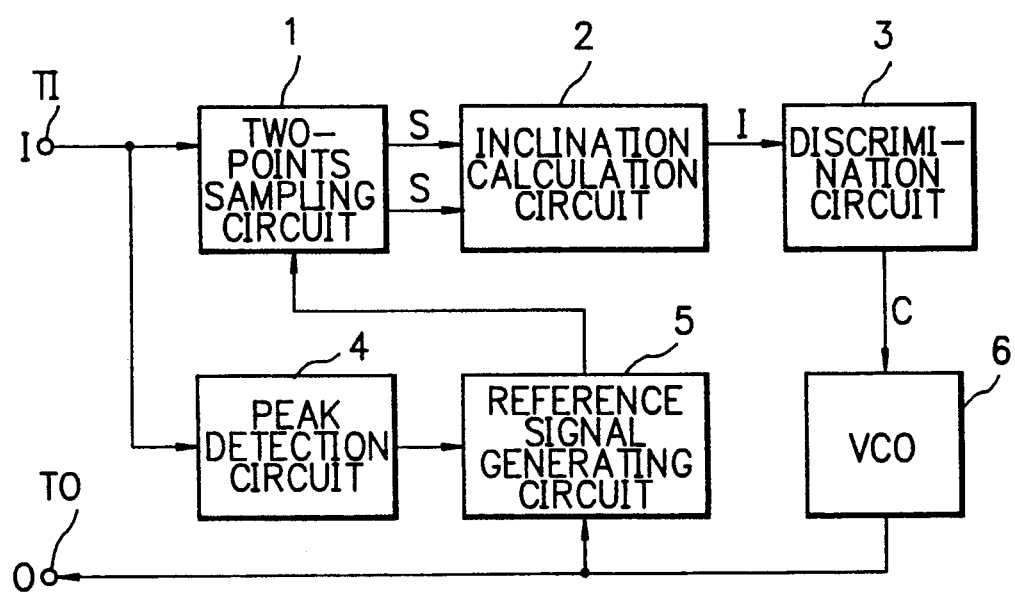

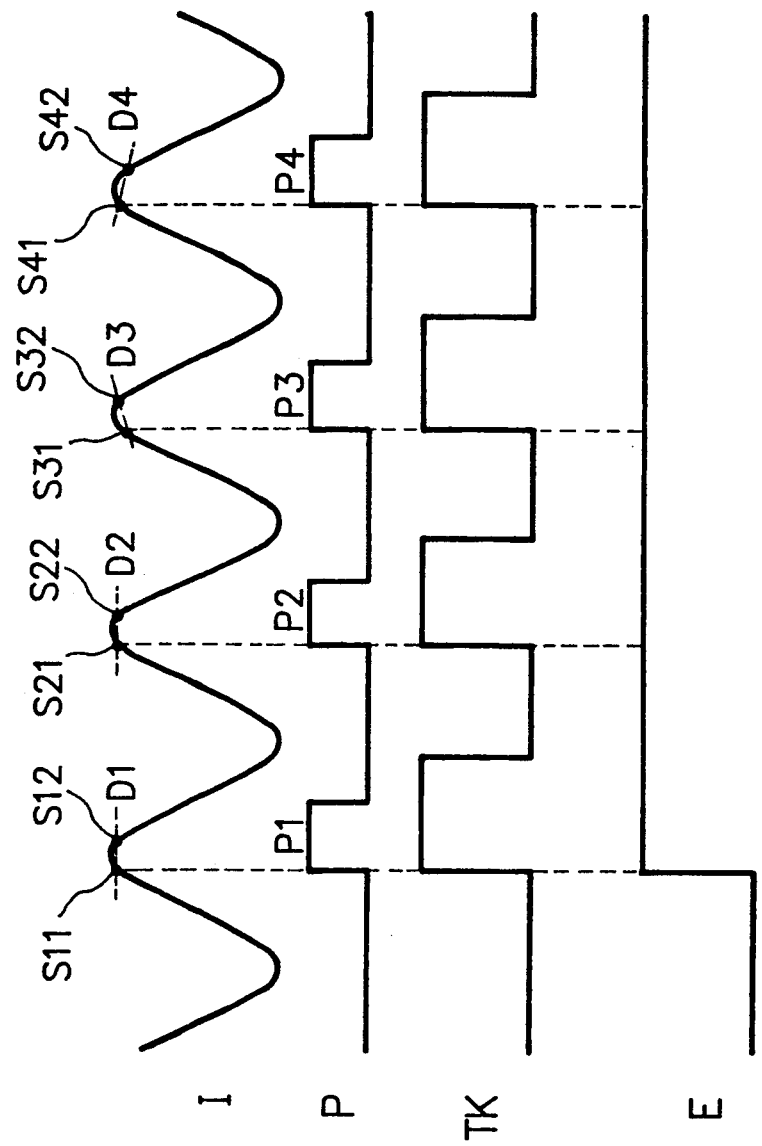

F I G. 7
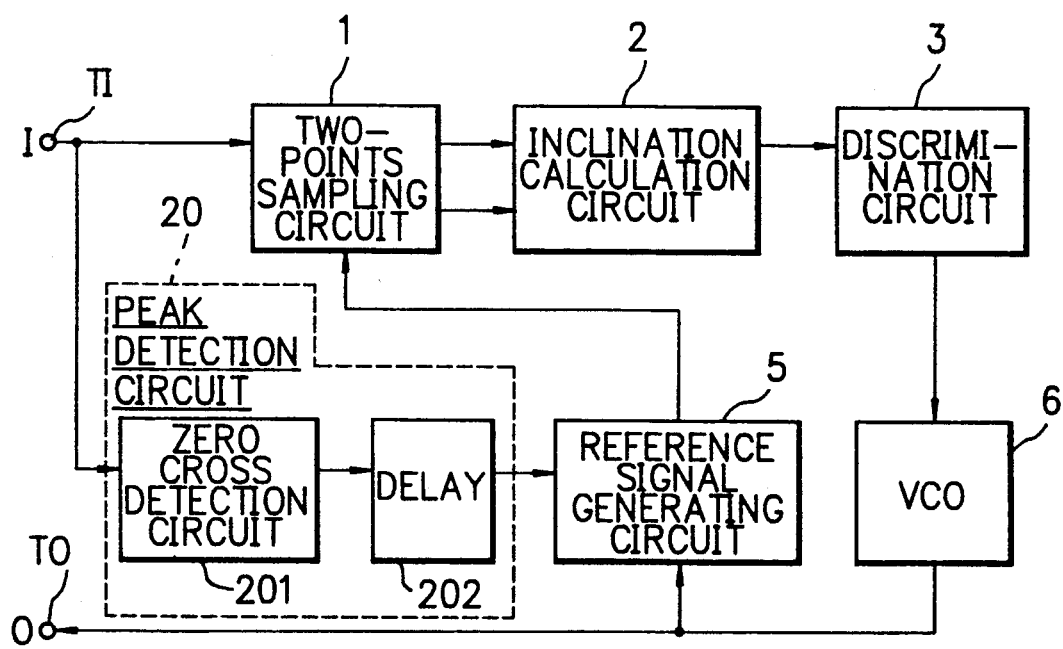

DIGITAL PLL CIRCUIT

BACKGROUND OF THE INVENTION

The present invention relates to a digital PLL circuit for use in a digital synthesizer or the like. Description of the Related Arts In a conventional digital PLL (phase-locked loop) circuit, a phase comparison is carried out at a zero cross point.

In FIG. 1 there is shown a conventional digital PLL circuit. The digital PLL circuit is comprised of a sampling circuit 7 for sampling input signals I, a discrimination circuit 8 for comparing an output value of the sampling circuit 7 with a predetermined threshold value T to generate a control signal C, a loop filter 9 for smoothing the control signal C output from the discriminating circuit 8 to output a smoothed control signal CS, a VCO (voltage-controlled oscillator) 6 controlled by the smoothed control signal CS output from the loop filter 9, a zero cross detection circuit 10 for detecting the zero cross point of the input signal I to output an enable signal E, and a reference signal generating circuit 5 set by the enable signal E to generate a timing signal TK to the sampling circuit 7 in synchronism with an output signal O of the VCO 6.

Next, the operation of the conventional digital PLL circuit will now be described in connection with FIG. 2.

FIG. 2 is a timing chart showing an operation of the conventional digital PLL circuit shown in FIG. 1. First, an input signal I of a sine wave signal given an A/D (analog-digital) conversion is input from an input terminal TI, and the input signal I is applied to the sampling circuit 7 and the zero cross detection circuit 10.

Next, the zero cross detection circuit 10 detects the zero cross point of the input signal I and outputs an enable signal E rising at a timing of the detection of the first zero cross signal Z1 to the reference signal generating circuit 5. This enable signal E, for example, can be generated by an RS (reset-set) flip-flop using the zero cross signal as a set signal.

Then, the reference signal generating circuit 5 inputs the output signal O of the VCO 6 at a timing of the setting of the enable signal E and outputs the timing signal TK whose frequency is synchronized with the output signal O.

In the sampling circuit 7, this timing signal TK is input as a sampling timing signal to carry out the sampling of the input signal I to output sample values S (S1 to S4).

Next, in the discrimination circuit 8, each sample value S is compared with a predetermined threshold value T to output a control signal C for the VCO 6. In this case, the threshold value T is either a positive threshold value TP or a negative threshold value TN with respect to the central value TO. For instance, as shown in FIG. 2, when the sample value S4 sampled by the positive threshold value TP is large, it is discriminated that the phase of the output signal O of the VCO 6 is lagged compared with the input signal I, and a control signal C for raising the frequency is output to the VCO 6. On the contrary, when the sample value 3 sampled by the negative threshold value TN is small, it is discriminated that the phase of the output signal O of the VCO 6 is led compared with the input signal I, and a control signal C for dropping the frequency is output to the VCO 6. Further, in case of the sample value S2 positioned between the positive threshold value TP and the negative threshold value TN, it is discriminated that the phase of the output signal O of the VCO 6 is equal to the input signal I, and a control signal C for maintaining the frequency is output to the VCO 6. Alternatively, in case of a VCO for holding the frequency when no control signal is input, the output of the control signal C is stopped. As described above, the discrimination circuit 8 controls the VCO 6 so that the sample value S obtained by sampling the input signal I in the sampling circuit 7 may be within a range between the positive threshold value TP and the negative threshold value TN.

Next, the output of the discrimination circuit 8 is smoothed in the loop filter 9 to output a smoothed control signal CS to the VCO 6. The VCO 6 is controlled by the smoothed control signal CS to output an output signal O having a predetermined frequency range as an output signal of the digital PLL circuit to an output terminal TO.

In the above-described conventional digital PLL circuit, when the value of the A/D-converted input signal is largely varied near the zero cross and the input signal is accompanied with an amplitude variation in particular, since the value near the zero cross is further increased, the variation of the output signal of the discrimination circuit becomes large and, even when the smoothing in the loop filter is carried out, a jitter of the output signal of the digital PLL circuit is still large.

SUMMARY OF THE INVENTION

It is therefore an object of the present invention to provide a digital PLL circuit in view of the afore-mentioned problems of the prior art, which is capable of reducing a variation of an output signal of a discrimination circuit and stabilizing a phase comparison operation to largely reduce a jitter of an output signal of the digital PLL circuit.

In accordance with one aspect of the present invention, there is provided a digital PLL circuit, comprising: a peak detection circuit for detecting peaks of an input signal level to output an enable signal by a first peak detection; a reference signal generating circuit made operable by the enable signal to output a timing signal synchronized with an output signal of a VCO; a two-points sampling circuit for sampling values of first and second data points determined at a predetermined time interval in the peak at a timing of the timing signal to output first and second sample values; an inclination calculation circuit for calculating an inclination value from the first and second sample values; and a discrimination circuit for discriminating whether the inclination value is zero or either a positive or negative value to output a control signal for the VCO depending on the discrimination result.

BRIEF DESCRIPTION OF THE DRAWINGS

The objects, features and advantages of the present invention will become more apparent from the consideration of the following detailed description, taken in conjunction with the accompanying drawings, in which:

FIG. 3 is a block diagram of a first embodiment of a digital PLL circuit according to the present invention;

FIG. 4 is a timing chart showing an operation of the digital PLL circuit shown in FIG. 3;

FIG. 7 is a block diagram of a second embodiment of a digital PLL circuit according to the present invention.

DESCRIPTION OF THE PREFERRED EMBODIMENTS

Figure 1:
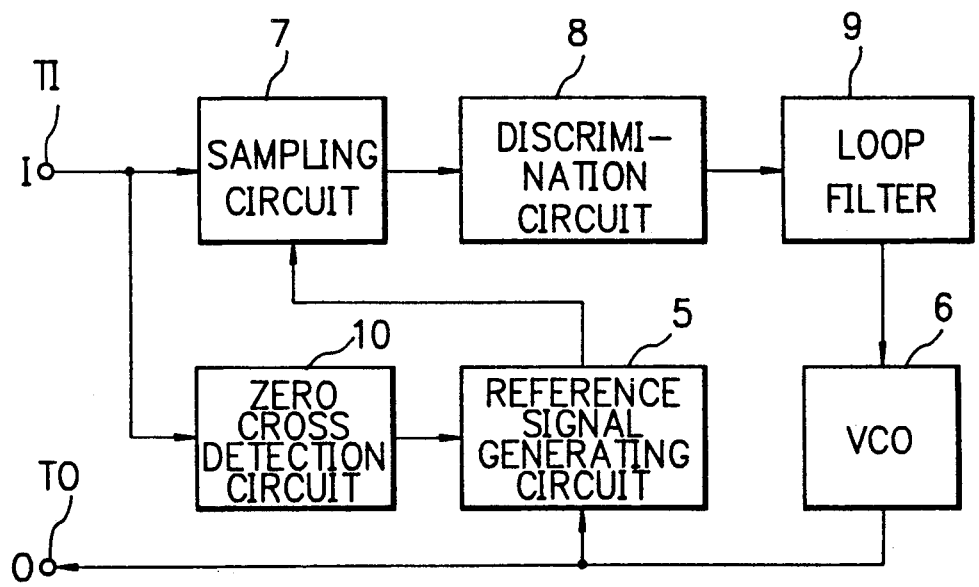
FIG. 1 is a block diagram of a conventional digital PLL circuit.
Figure 2:
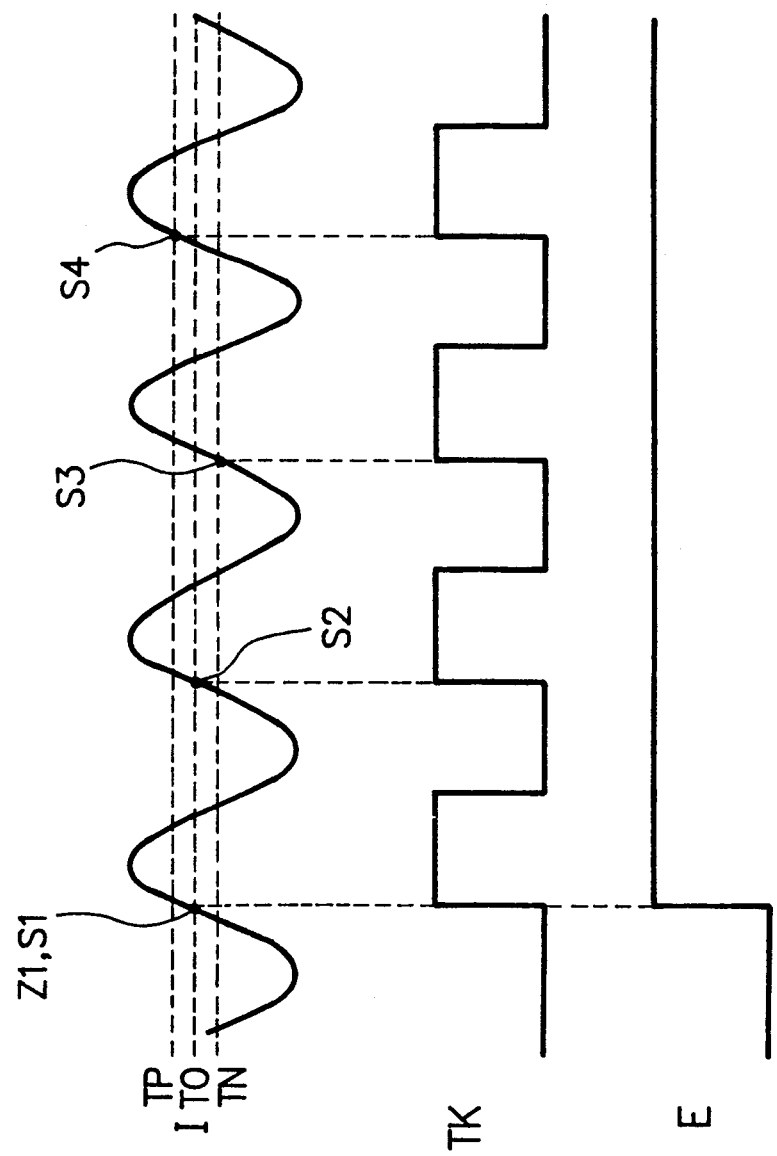
FIG. 2 is a timing chart showing an operation of the digital PLL circuit shown in FIG. 1.

Referring now to the drawings, wherein like reference characters designate like or corresponding parts throughout the views and thus the repeated description thereof can be omitted for brevity, there is shown in FIG. 3 the first embodiment of a digital PLL circuit according to the present invention.

As shown in FIG. 3, the digital PLL circuit is comprised of a two-point sampling circuit 1 for sampling values of two data points determined at a peak portion of an input signal I to output two sample values S, an inclination calculation circuit 2 for calculating a difference between the two sample values S output from the two-points sampling circuit 1 as an inclination value D, a discrimination circuit 3 for discriminating whether the inclination value output from the inclination calculation circuit 2 is zero or either a positive or negative value to output a control signal C corresponding to the discrimination result, a peak detection circuit 4 for detecting peaks of an input signal level to output an enable signal E, a VCO 6 controlled by the control signal C output from the discrimination circuit 3, and a reference signal generating circuit 5 set by the enable signal E to generate a timing signal TK to the two-points sampling circuit 1 in synchronism with an output signal 0 of the VCO 6.

Next the operation of the digital PLL circuit shown in FIG. 3 will now be described in connection with FIG. 4.

FIG. 4 is a timing chart showing an operation of the digital PLL circuit shown in FIG. 3. First, an input signal I of a sine wave signal subjected to an A/D conversion is input from an input terminal TI, and the input signal I is applied to the two-points sampling circuit 1 and the peak detection circuit 4.

Next, the peak detection circuit 4 detects peaks of the level of the input signal I and outputs an enable signal E rising at a timing of the detection of the first peak P1 to the reference signal generating circuit 5. This enable signal E, for example, can be generated by an RS flip-flop using the first peak P1 as a set signal.

Then, the reference signal generating circuit 5 inputs the output signal 0 of the VCO 6 at a timing of the setting of the enable signal E and outputs the timing signal TK whose frequency (phase) is synchronized with the output signal 0. This, for example, can be comprised of a clock generator circuit for generating a clock signal CK having a higher frequency than the timing signal TK by using a known crystal oscillator circuit or the like, a shaping circuit for shaping the output signal 0 of the VCO 6 into a rect-angular wave signal, a gate circuit for gating the clock signal CK by the rectangular wave signal output from the shaping circuit, and a flip-flop or the like for performing a set and reset of the output of the gate circuit to output the timing signal TK synchronized with the output signal 0 of the VCO 6.

This timing signal TK as a sampling timing signal of the first sampling point is input to the two-points sampling circuit 1. The two-points sampling circuit 1 samples the pairs of sampling points of a time interval determined in the peaks of the level of the input signal I to output sample values S11 to Sn1 of the first sampling points and sample values S12 to Sn2 of the second sampling points.

Next, the inclination calculation circuit 2 calculates the inclination values D between the first and second sampling points. The inclination value D can be readily obtained by a known subtractor circuit or the like for calculating the difference of the two values such as the sample values S11 and S12. Also, by using a differentiator circuit, the inclination value D can be obtained.

In the discrimination circuit 3, it is discriminated whether the inclination value D output from the inclination calculation circuit 2 is zero or either the positive or negative value and the control signal C is output to the VCO 6 depending on the discrimination result. For instance, when the two sample values such as S21 and S22 are equal and thus the inclination value D2 to be calculated is zero, since it is considered that the two sampling points are symmetrical around the level peak point, it is discriminated that the phase of the input signal I is coincident with that of the output signal 0 of the VCO 6, and hence a control signal C for holding the frequency is output to the VCO 6. Alternatively, in case of a VCO of a frequency holding type when no control signal is input, the output of the control signal C is stopped. Further, for example, when the first sampling point value is smaller than the second sampling point value such as the two value S31 and S32 and thus the inclination value D3 to be calculated is a positive value, since the two sampling points are positioned in front of the symmetrical time point around the level peak point, it is discriminated that the phase of the output signal 0 of the VCO 6 is led compared with the input signal I, and thus a control signal C for dropping the frequency is output to the VCO 6. On the contrary, when the first sampling point value is large than the second sampling point value such as the two value S41 and S42 and thus the inclination value D4 to be calculated is a negative value, since the two sampling points are positioned in rear of the symmetrical time point around the level peak point, it is discriminated that the phase of the output signal 0 of the VCO 6 is lagged compared with the input signal I, and thus a control signal C for raising the frequency is output to the VCO 6.

As described above, the discrimination circuit 3 controls the VCO 6 so that the inclination value D obtained in the inclination calculation circuit 2 maybe zero. This inclination value D can be zero when the two sampling points are symmetrical around the level peak point of the input signal I. Also, when the symmetrical time point of the two sampling points is shifted a little frontwards or rearwards from the level peak point of the input signal I, the positive or negative value is obtained. Further, the inclination value D is small near the level peak point of the input signal I and becomes the maximum near the zero cross point.

Further, even when a locus of an envelope coupling the level peak points of the input signal I is varied without keeping a fixed value, that is, accompanied with an amplitude variation, though the adjacent two points sampling values near the peak point themselves are varied, the difference between the two points sampling values, that is, the inclination value is not varied. Hence, the phase comparison result can not be affected by the variation of the sampling values themselves, and they can be extracted as the signals reflected with the phase differences only.

Then, the control signal C output from the discrimination circuit 3 is directly input to the VCO 6. The VCO 6 is controlled by the control signal C to output an output signal 0 having a predetermined frequency range as an output signal of the digital PLL circuit to an output terminal TO.

In this embodiment, although it is assumed that the input signal I is the sine wave signal, of course, it is clear that the present invention can be applicable to other signals such as a triangular wave signal, a sawtooth wave signal or the like except a square or rectangular wave signal, in which the level peak is present in two points of the positive and negative sides in one cycle.

Next, the essential components of the structure of this embodiment will now be described in detail.

Figure 5A:
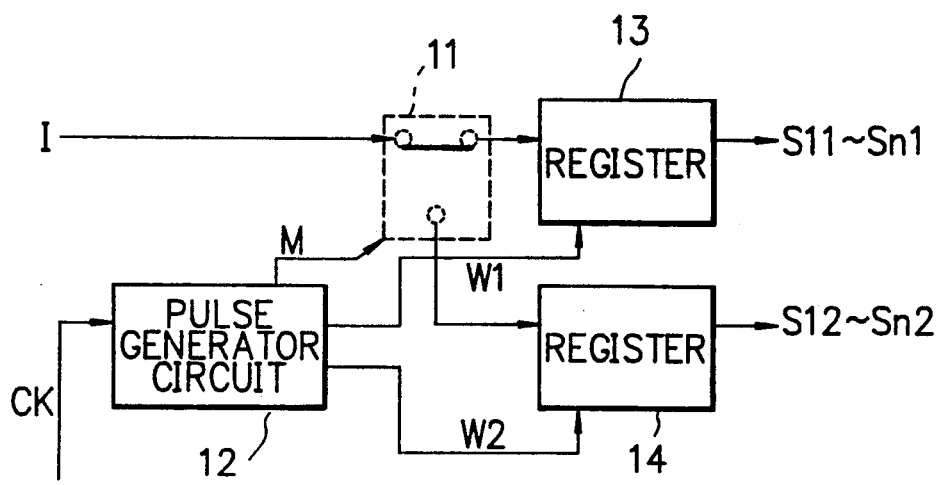
FIG. 5A is a block diagram of a two-points sampling circuit shown in FIG. 3
Figure 5B:
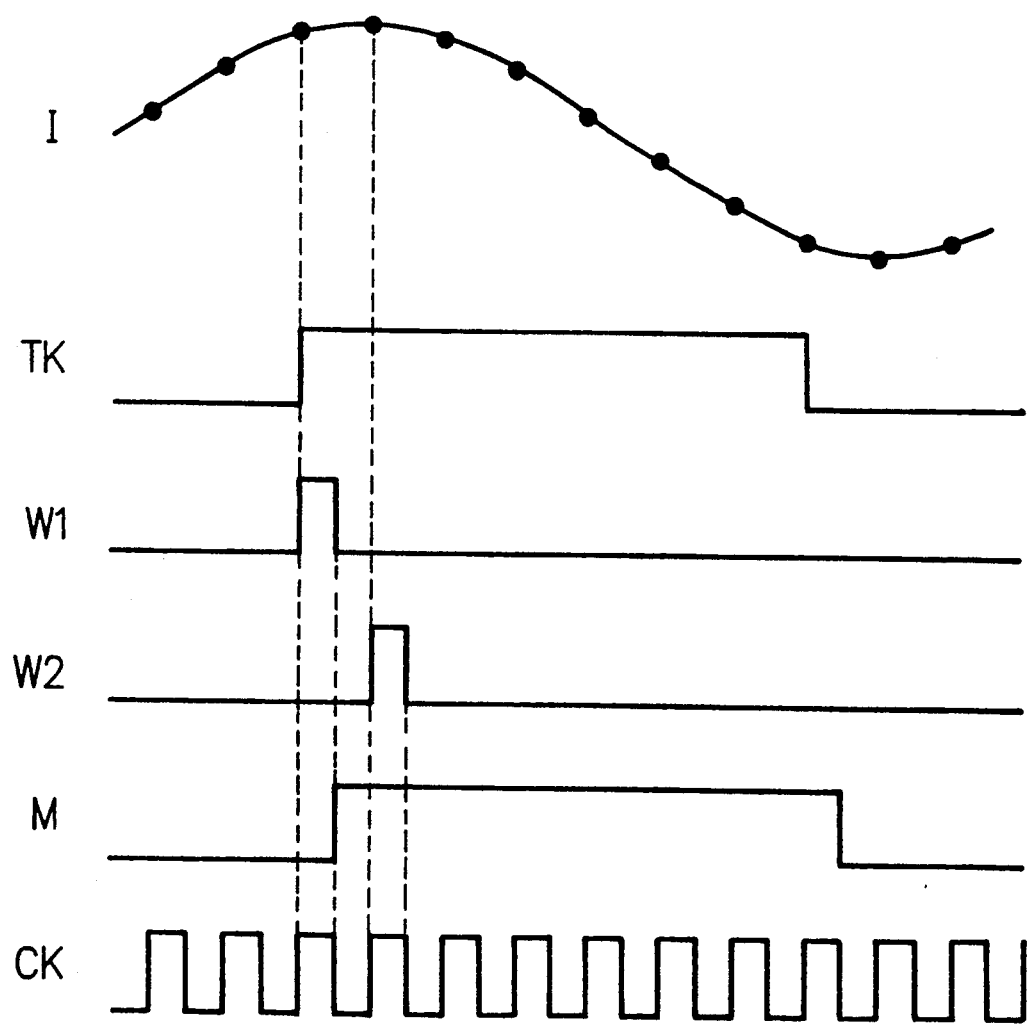
FIG. 5B is a timing chart showing an operation thereof.

FIG. 5A shows one embodiment of the two-points sampling circuit 1 shown in FIG. 3 and FIG. 5B is a timing chart showing the operation thereof. As shown in FIG. 5A, the two-points sampling circuit 1 includes a multiplexer 11, a pulse generator circuit 12, and first and second registers 13 and 14.

Next, the operation of the two-points sampling circuit 1 shown in FIG. 5A will now be described. First, the input signal I subjected to the A/D conversion is input to the multiplexer 11, and an output of the multiplexer 11 is input to either the first register 13 or the second register 14. The first register 13 outputs the first sampling point sample values S11 to Sn1 and the second register 14 outputs the second sampling point sample values S12 to Sn2. By the timing signal TK, the pulse generator circuit 12 generates a first write signal W1 to be sent to the first register 13, a second write signal W2 which is delayed for a set time compared with the first write signal W1 and to be sent to the second register 14, and a switch signal M for switching the multiplexer 11. The time between the two write signals W1 and W2 corresponds to a set time between the two sampling points, for example, one clock amount of the clock signal CK for generating the timing signal TK. Also, the switch signal M is generated by delaying the timing signal TK for the ½ clock amount.

Figure 6A:
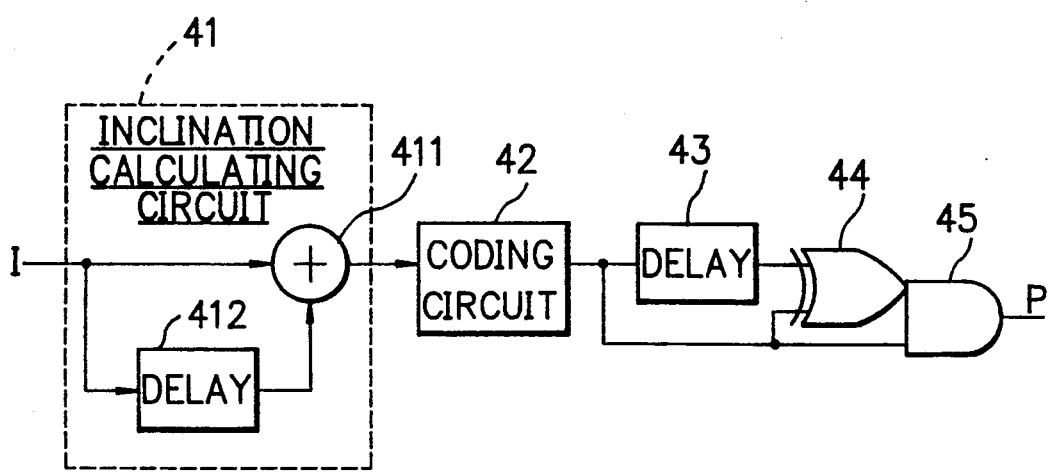
FIG. 6A is a block diagram of a peak detection circuit shown in FIG. 3
Figure 6B:
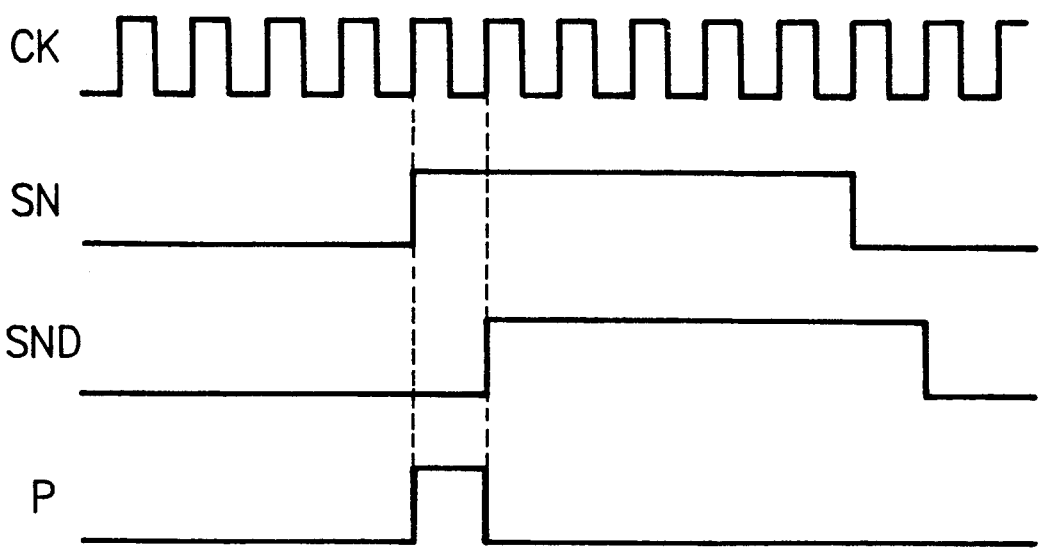
FIG. 6B is a timing chart showing an operation thereof.

FIG. 6A shows one embodiment of the peak detection circuit 4 shown in FIG. 3 and FIG. 6B is a timing chart showing the operation thereof. As shown in FIG. 6A, the peak detection circuit 4 includes an inclination calculating circuit 41 for calculating an inclination value L of the input signal I, a coding circuit 42 for extracting code bits SN of the inclination value L, a delay circuit 43 for delaying one clock amount of the clock signal CK, an exclusive logical OR circuit 44 and an AND circuit 45. The inclination calculating circuit 41 includes a subtracter circuit 411 and a delay circuit 412 for delaying one clock amount of the clock signal CK.

Next the operation of the peak detection circuit 4 shown in FIG. 6A will now be described. First, the input signal I is input to the inclination calculating circuit 41, and the inclination calculating circuit 41 calculated the inclination value L between the adjacent two points of the input signal I and outputs the inclination value L to the coding circuit 42. Then, the coding circuit 42 extracts only the code bits SN of the inclination value L and outputs the code bits SN to the delay circuit 43, the exclusive logical OR circuit 44 and the AND circuit 45. These logical circuits detect a changing timing of the code bits SN from a positive value to a negative value. The exclusive logical OR circuit 44 performs an exclusive logical OR calculation of a code SND of the inclination value delayed in the delay circuit 43 and the code SN of the inclination value before delaying. Then, the AND circuit 45 executes a logical product calculation of the output of the exclusive logical OR circuit 44 and the code SN of the inclination value before delaying to output a peak detection signal P to the reference signal generating circuit 5.

Further, as described above, on the output side of the AND circuits 45, an RS flip-flop (not shown) is provided, and by setting the RS flip-flop by the first peak detection signal P1, the enable signal E is generated from the peak detection circuit 4 to the reference signal generating circuit 5.

In FIG. 7, there is shown the second embodiment of a digital PLL circuit according to the present invention, having the same construction as the first embodiment shown in FIG. 3, except that a peak detection circuit 20 including a zero cross detection circuit 201 and a delay circuit 202 is used in place of the peak detection circuit 4.

In this embodiment, the peak detection circuit 20 uses the fact that the peak point of the input signal can be determined by delaying a predetermined time from the zero cross point when the frequency is decided. Further, in the digital PLL circuit for generating a plurality of frequen-cies, usually, there is a signal for selecting any of the frequencies, and thus it is easy to select the corresponding delay time by using this selecting signal.

As described above, according to the present invention, in the digital PLL circuit, by providing a peak detection circuit for detecting a peak of an input signal level, a two-points sampling circuit for outputting two sample values of two data points positioned at a predetermined time interval in the peak, an inclination calculation circuit for calculating an inclination value from the two sample values, and a discrimination circuit for discriminating whether the inclination value is zero or either a positive or negative value to output a control signal for an VCO depending on the discrimination result, a phase discrimination is carried out by using the sample values near a peak level with a less variation than a zero cross point. Hence, a variation of an output signal of the discrimination circuit is prevented and a phase comparison operation is stabilized to largely reduce a jitter of an output signal of the digital PLL circuit.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:
1. A digital PLL circuit, comprising:
a peak detection circuit for detecting peaks of an input signal level to output an enable signal by a first peak detection;
a reference signal generating circuit made operable by the enable signal to output a timing signal synchronized with an output signal of a VCO;

a two-points sampling circuit for sampling values of first and second data points determined at a predetermined time interval in the peak at a timing of the timing signal to output first and second sample values;

an inclination calculation circuit for calculating an inclination value from the first and second sample values; and a discrimination circuit for discriminating whether the inclination value is zero or either a positive or negative value to output a control signal for the VCO depending on the discrimination result.

2. The circuit as claimed in claim 1, wherein the two-points sampling circuit includes:

first and second registers for storing the first and second sample values by first and second write signals, respectively;

a multiplexer for switching to store the input signal into either the first register or the second register by a switch signal; and a pulse generator circuit for generating the first and second write signals of the predetermined time interval for performing a write control against the first and second registers and the switch signal for the multiplexer by using the timing signal.

3. The circuit as claimed in claim 1, wherein the peak detection circuit includes:

an inclination calculating circuit for calculating an inclination of the input signal to output the inclination value;

a coding circuit for extracting code bits of the inclination value;

a delay circuit for delaying the code bits for one clock amount of the clock signal to output a delayed code bits;

an exclusive logical OR circuit for outputting an exclusive logical OR of the code bits and the delayed code bits; and an AND circuit for outputting a logical product of the code bits and the exclusive logical OR.

4. The circuit as claimed in claim 1, wherein the peak detection circuit includes:

a zero cross detection circuit for detecting a zero cross point of the input signal; and a zero cross delay circuit for delaying time data at the zero cross point detected by the zero cross detection circuit for a predetermined time.

* * * * *